United States Patent
Ogusu

(10) Patent No.: US 7,352,441 B2
(45) Date of Patent: Apr. 1, 2008

(54) SENSOR UNIT, EXPOSURE APPARATUS, AND DEVICE MANUFACTURING METHOD

(75) Inventor: Makoto Ogusu, Shimotsuke (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/617,487

(22) Filed: Dec. 28, 2006

(65) Prior Publication Data

US 2007/0153251 A1    Jul. 5, 2007

(30) Foreign Application Priority Data

Jan. 5, 2006   (JP) .............................. 2006-000615

(51) Int. Cl.
G03B 27/54    (2006.01)
G03B 27/72    (2006.01)
(52) U.S. Cl. .......................................... 355/67; 355/71
(58) Field of Classification Search .................. 355/53, 355/55, 67–69; 250/548; 356/399–401
See application file for complete search history.

(56) References Cited

U.S. PATENT DOCUMENTS 6,151,102 A * 11/2000 Nishi ........................... 355/53
7,193,685 B2 * 3/2007 Miura ........................... 355/55
2005/0128453 A1   6/2005 Miura
2005/0146693 A1   7/2005 Ohsaki
2006/0044538 A1 * 3/2006 Amemiya et al. ............. 355/55

FOREIGN PATENT DOCUMENTS

| JP | 2005-166722 | 6/2005 |
| JP | 2005-175034 | 6/2005 |
| JP | 2005-175400 | 6/2005 |

* cited by examiner

Primary Examiner—Henry Hung Nguyen
(74) Attorney, Agent, or Firm—Morgan & Finnegan, LLP

(57) ABSTRACT

A sensor unit includes a substrate that has a first mark, and a second mark used to specify a position of the first mark, a sensor for detecting light that has transmitted through the first mark and the substrate, and a light shielding portion, provided between the second mark and the sensor, for shielding the light from the second mark against the sensor.

7 Claims, 8 Drawing Sheets

SENSOR UNIT, EXPOSURE APPARATUS, AND DEVICE MANUFACTURING METHOD

BACKGROUND OF THE INVENTION

The present invention relates to a sensor unit, an exposure apparatus, and a device manufacturing method.

A conventional projection exposure apparatus projects and exposes a circuit pattern of a reticle (mask) onto a wafer via a projection optical system in manufacturing a fine semiconductor device and liquid crystal display ("LCD") device.

In the exposure apparatus, the pattern's critical dimension becomes very smaller, and each component is thoroughly improved. For example, a finer pattern is used for the measurement. A sensor unit is thus proposed which measures a focal plane of the projection optical system. See, for example, Japanese Patent Applications, Publication Nos. 2005-175400, 2005-166722, and 2000-175034.

The sensor unit, as used herein, measures a focal plane of the projection optical system by receiving, through a sensor, the light that has passed a reference mark. The reference mark has a pinhole or a slit that transmits the light. A substrate that has the reference mark also has another mark that is used to adjust a position of the reference mark before the above measurement. The other mark used for the positional adjustment of the reference mark is a reflection mark, and a position of the other mark is detected when a sensor detects the light reflected on the other mark.

Conventionally, in detecting the light that has transmitted through the reference mark, the sensor also detects the light that has transmitted through the reflection mark, such as the other mark used to adjust the position of the reference mark, and thus the S/N ratio deteriorates.

As the high measurement accuracy is increasingly demanded, the S/N ratio must be further improved. Therefore, the slight deterioration of the S/N ratio becomes non-negligible.

BRIEF SUMMARY OF THE INVENTION

The present invention is directed to a sensor unit that is configured to refrain from detecting the light that has transmitted through the reflection mark, an exposure apparatus having the same, and a device manufacturing method using the exposure apparatus.

A sensor unit according to one aspect of the present invention includes a substrate that has a first mark, and a second mark used to specify a position of the first mark, a sensor for detecting light that has transmitted through the first mark and the substrate, and a light shielding portion, provided between the second mark and the sensor, for shielding the light from the second mark against the sensor.

Other objects and further features of the present invention will become readily apparent from the following description of the preferred embodiments with reference to accompanying drawings.

DETAILED DESCRIPTION OF THE PREFERRED EMBODIMENTS

Figure 1:
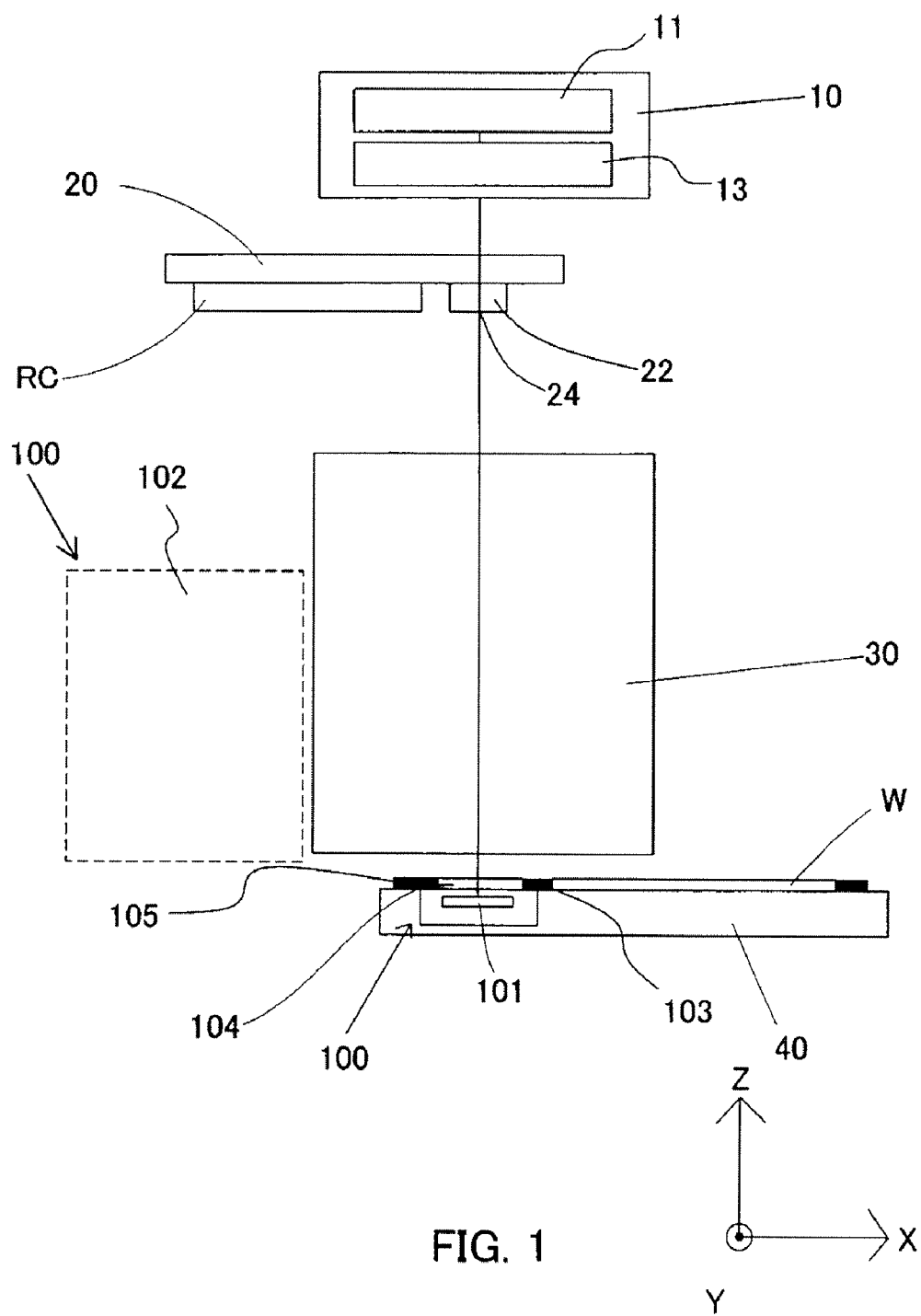
FIG. 1 is a schematic block diagram showing an exposure apparatus according to one embodiment.

Referring now to FIG. 1, a description will be given of an illustrative exposure apparatus 1 according to one embodiment. FIG. 1 is a schematic block diagram of the exposure apparatus 1. The exposure apparatus 1 includes, as shown in FIG. 1, an illumination apparatus 10, a reticle stage 20, a projection optical system 30, a wafer stage 40, and a sensor unit 100.

The exposure apparatus 1 is a projection exposure apparatus that exposes a circuit pattern of the reticle (mask) RC onto a wafer W, for example, in a step-and-scan manner. However, a step-and-repeat exposure apparatus may also be applicable.

The illumination apparatus 10 illuminates the reticle RC that has a circuit pattern to be transferred. The illumination apparatus 10 includes a light source 11, and an illumination optical system 13.

The light source 11 can use an ArF excimer laser with a wavelength of approximately 193 nm. In that case, it is preferable to use both a beam shaping optical system that shapes the collimated beam from the laser light source into a desired beam shape, and an incoherent tuning optical system that makes the coherent laser beam incoherent. Alternatively, the light source 11 can use a KrF excimer laser having a wavelength of about 248 nm, an $F_2$ laser with a wavelength of approximately 157 nm, or one or more mercury or xenon lamps.

The illumination optical system 13 is an optical system that illuminates the reticle RC using the light from the light source 11.

The reticle stage 20 supports the reticle RC.

The reticle RC is made, for example, of quartz, and has a circuit pattern to be transferred.

The projection optical system 30 serves to project the pattern of the reticle RC onto the wafer W. The projection optical system 30 can use a dioptric, catadioptric, or catoptric optical system.

The wafer W is a substrate to be exposed, and a photoresist is applied to the wafer W. The substrate can use a glass plate in addition to the wafer.

The wafer stage 40 supports the wafer W.

The sensor unit 100 is used to measure a focal position of the projection optical system 30. In addition to the measurement of the focal position of the projection optical system 30, the sensor unit 100 can be used to measure the light quantity on the image or focal plane of the projection optical system 30, to measure the wavefront aberration of the projection optical system 30, and for other measurements.

The sensor unit 100 includes a first sensor 101, a second sensor 102, a first mark 103, a second mark 104, and a light shielding portion 105.

The first sensor 101 detects the light that has transmitted through the first mark 103. The first mark has a pinhole or a slit that transmits the light. The first sensor 101 is a photoelectric conversion element, such as a CCD.

The second sensor 102 detects the light reflected on the second mark 104, and thus detects a position of the second mark 104.

Figure 2:
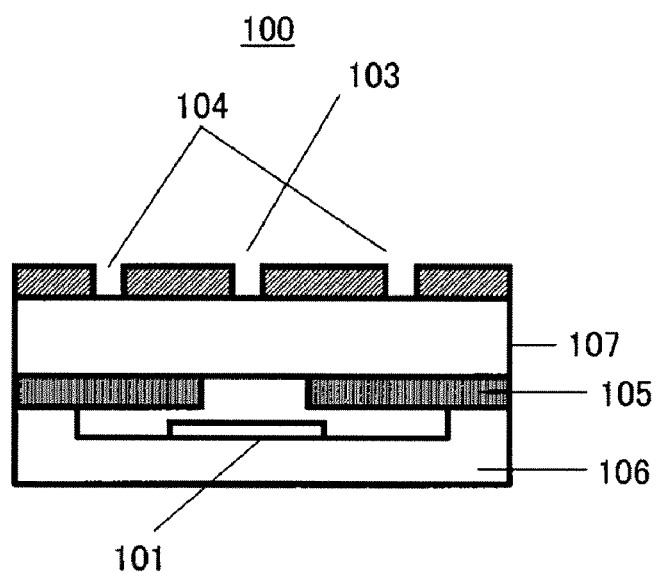
FIG. 2 is a schematic sectional view showing a sensor unit shown in FIG. 1.

The first mark 103 is a transmission mark, and the light that has transmitted through the mark 103 is detected by the sensor 101. The first mark 103 is formed on a substrate 107 as shown in FIG. 2. Here, FIG. 2 is a sectional view of the sensor unit 100.

The second mark 104 is a reflection mark, and the light reflected on the mark 104 is detected by the sensor 102. The second mark 104 is arranged on the substrate 107, and in this embodiment, it is located near the first mark 103. This embodiment simultaneously forms the first mark 103 and the second mark 104, and improves the efficiency of the manufacturing process. The light shielding portions 105 shield the light that has transmitted through the second mark 104 as shown in FIG. 2. Conventionally, the light transmits through an opening of the reflection mark, reaches the sensor that is designed to detect the light from the transmission mark, and becomes the noise. This embodiment arranges the light shielding portions 105 each made of a light shielding film opposite to the second marks 104 at the back of the substrate 107 so as not to shield the light which transmits the first (transmission) mark 103. This configuration prevents the unnecessary light that passes through the second (reflection) marks 104 from reaching the first sensor 101 in the measurement that uses the first mark 103. As a result, the sensor unit 100 reduces the measurement error, and provides a highly precise measurement.

An absorption film may be used for the light shielding portion 105 instead of the light shielding film so as to provide a similar effect. The absorption film aggressively restrains reflections in the substrate 107. This embodiment can arrange the reflection mark on the same substrate together with the transmission mark, and the configuration of this embodiment can prevent transmissions of the unnecessary light that deteriorates the S/N ratio of the light detecting sensor.

The first sensor 101 is located in a sensor package 106 that has such a U shape that the first sensor 101 does not contact the light shielding portion 105.

Figure 3:
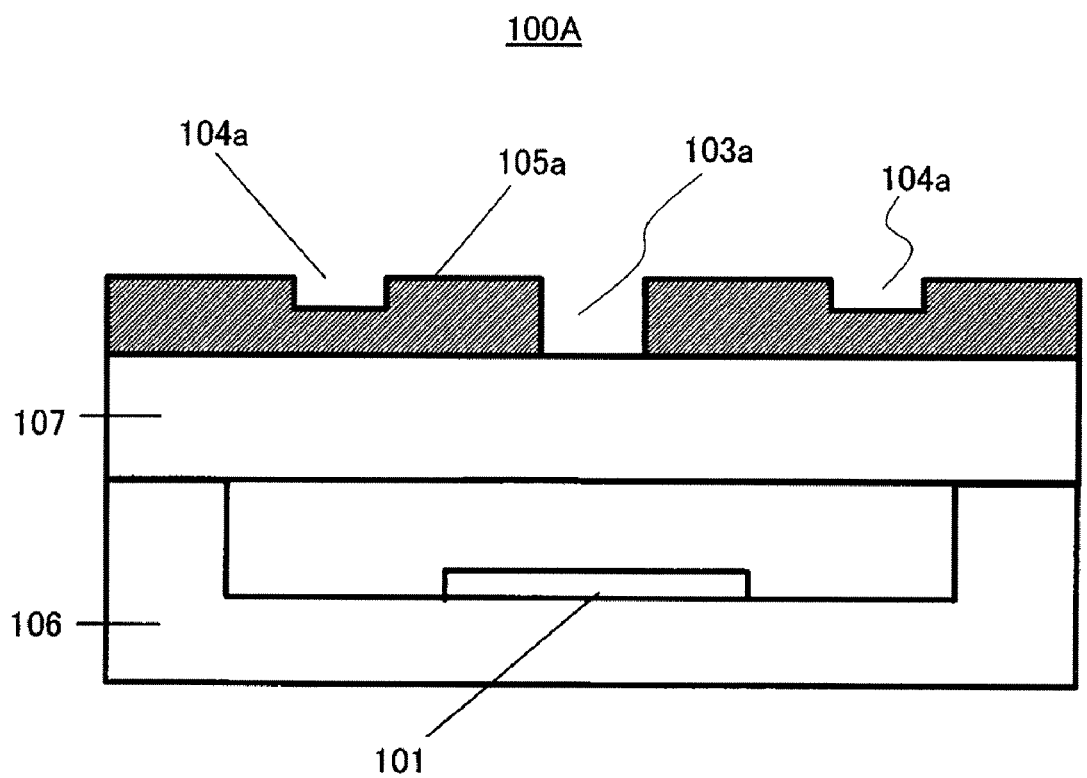
FIG. 3 is a schematic sectional view showing a variation of the sensor unit shown in FIG. 2.

Referring now to FIG. 3, a description will be given of a sensor unit 100A as a variation of the sensor unit 100. Here, FIG. 3 is a sectional view of the sensor unit 100A.

Figure 4A:
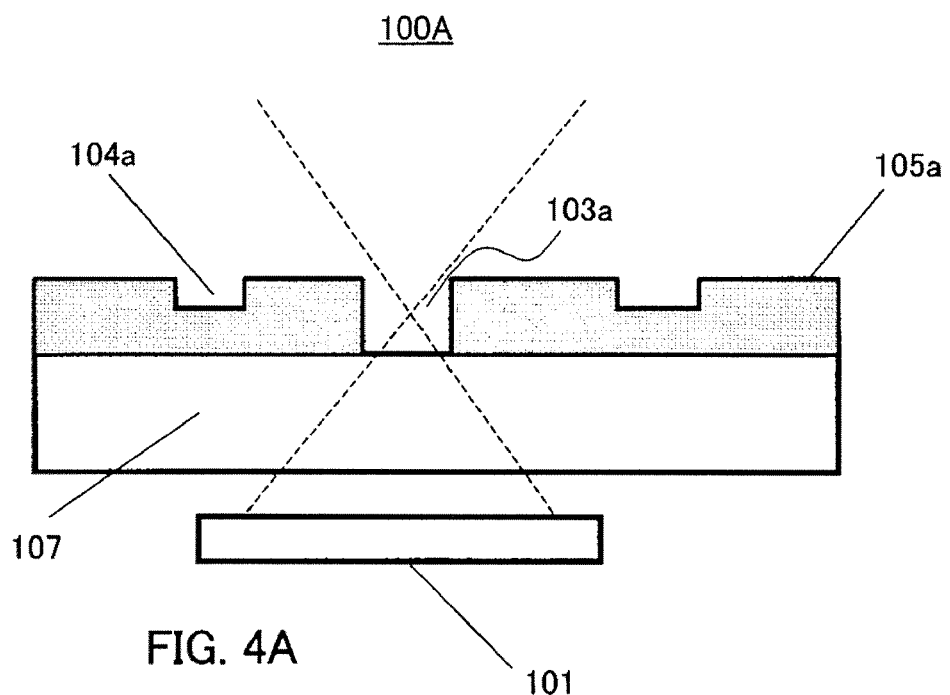
FIGS. 4A and 4B are schematic sectional views showing the sensor unit shown in FIG. 3.
Figure 4B:
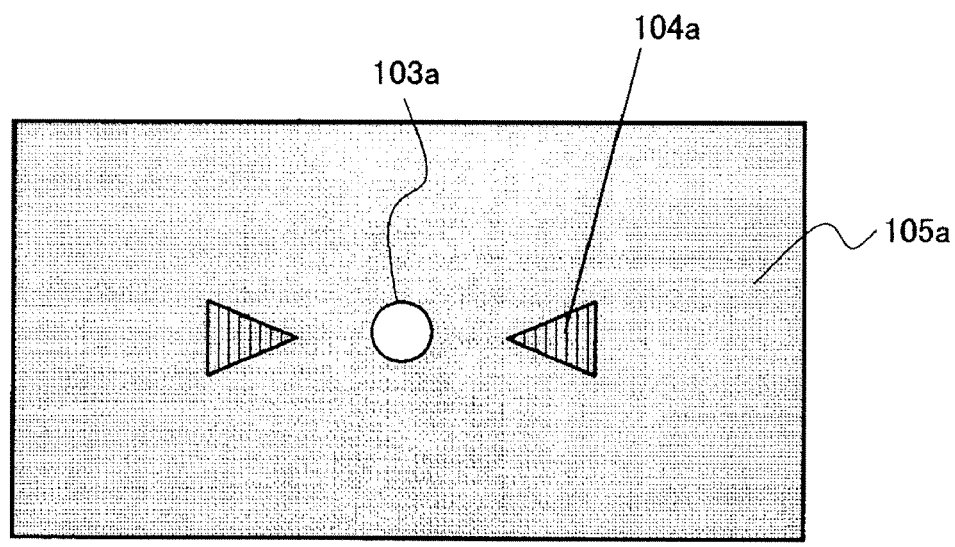

The sensor unit 100A has a pair of second marks 104a made by forming a step on the surface of each light shielding portion 105a. FIG. 4A and 4B show an illustration of the second marks 104a formed on the light shielding portion 105a and the first mark 103a formed on the substrate 107. The light that has transmitted through the first mark 103a is measured by using the first sensor 101. Actually, the first mark 103a is not as large as that shown in FIG. 4A, and can often be very small. Accordingly, before the measurement, a position of the first mark 103a is roughly specified by the second marks 104a each of which is much larger than the first mark 103a.

This embodiment detects each second mark 104a by the contrast that is generated by scattering at the edge part of the second mark 104a. No light passes the second mark 104a. As a result, no light reaches the first sensor 101 from the second mark 104a. The light that transmits the first mark 103a is detectable without deteriorating the S/N ratio. Although not shown, an absorption film having a desired thickness may be provided between the light shielding portion 105a and the substrate 107.

The configuration of this embodiment can prevent the unnecessary light from the second (reflection) mark 104a from reaching the first sensor 101 in detecting the transmitting light from the first mark 103a. As a result, the sensor unit 100A reduces a measurement error, and provides a highly precise measurement.

Figure 5:
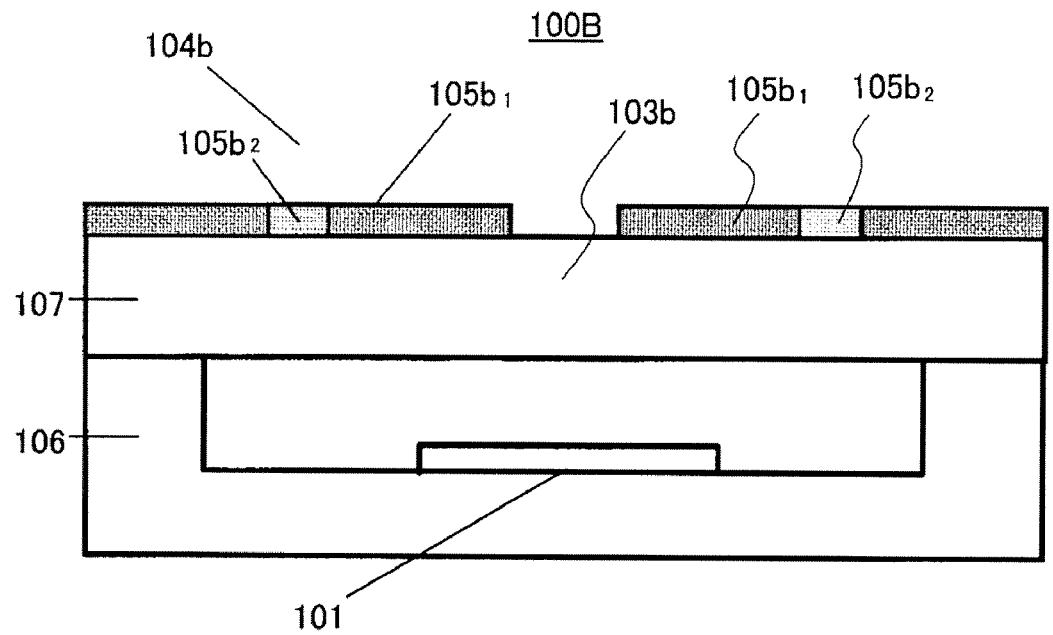
FIG. 5 is a schematic sectional view showing a variation of the sensor unit shown in FIG. 2.

Referring now to FIG. 5, a description will be given of a sensor unit 100B as a variation of the sensor unit 100. Here, FIG. 5 is a sectional view of the sensor unit 100B.

A second mark 104b of the sensor unit 100B has light shielding portions $105b_1$ and $105b_2$ that are made of different materials. Therefore, the second mark 104b has different reflectances according to locations. As a result, the second mark 104b is detectable by the contrast obtained by the second sensor 102. The second mark 104b can be configured without transmitting the unnecessary light that deteriorates the S/N ratio of the sensor 101 that monitors the transmitting light. In addition, this embodiment can make the mark 104b's top surface flat.

This embodiment can prevent the unnecessary light that has passed the second (reflection) mark 104b from reaching the first sensor 101 in the measurement using the first mark 103b. As a result, the sensor unit 100B reduces a measurement error, and provides a highly precise measurement.

Figure 6:
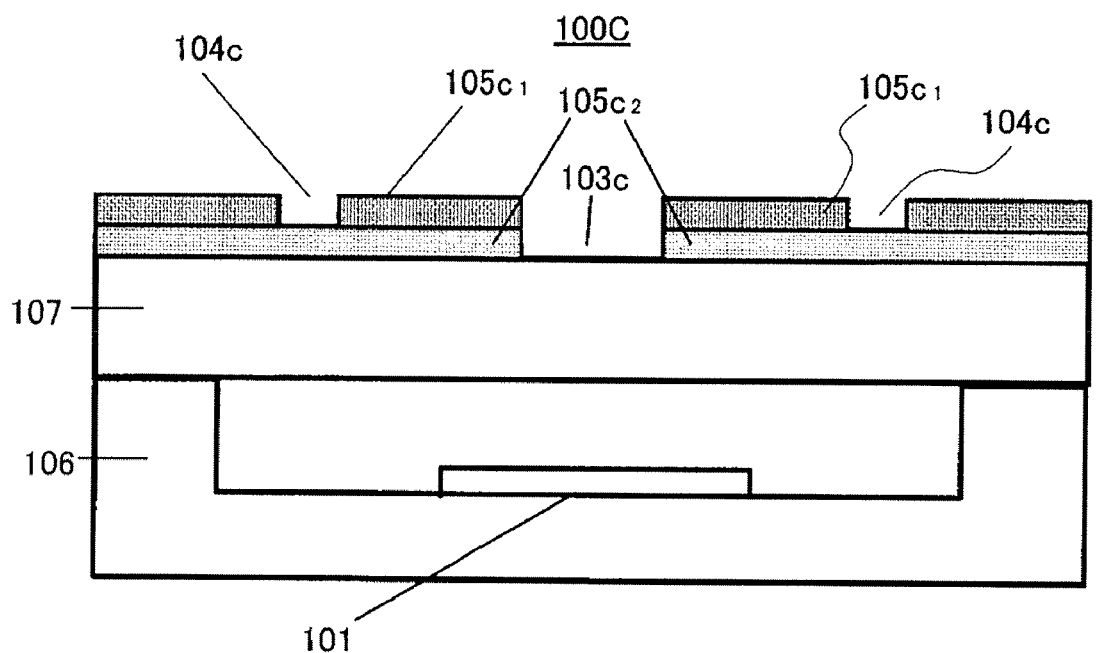
FIG. 6 is a schematic sectional view showing a variation of the sensor unit shown in FIG. 2.

Referring now to FIG. 6, a description will be given of a sensor unit 100C as a variation of the sensor unit 100. Here, FIG. 6 is a sectional view of the sensor unit 100C.

The second mark 104c of the sensor unit 100C has light shielding portions $105c_1$ and $105c_2$ that are made of different materials.

The second mark 104c is made by layering these light shielding portions $105c_1$ and $105c_2$. The light shielding portion $105c_2$ exposes at removed part of the light shielding portion $105c_1$ by executing a removing process, such as etching, for it, and thus the second mark 104c is prepared.

Since the light shielding portions $105c_1$ and $105c_2$ have different reflectances, the second mark 104c is detectable using the second sensor 102. This embodiment can also prevent transmissions of the unnecessary light that deteriorates the S/N ratio of the measurement system that monitors the transmitting light. In addition, this embodiment can comparatively easily perform the manufacturing process.

Thus, this embodiment can prevent the unnecessary light that has passed the second (reflection) mark 104c from reaching the first sensor 101 in the measurement using the first mark 103c. As a result, the sensor unit 100C reduces a measurement error, and provides a highly precise measurement.

Figure 7:
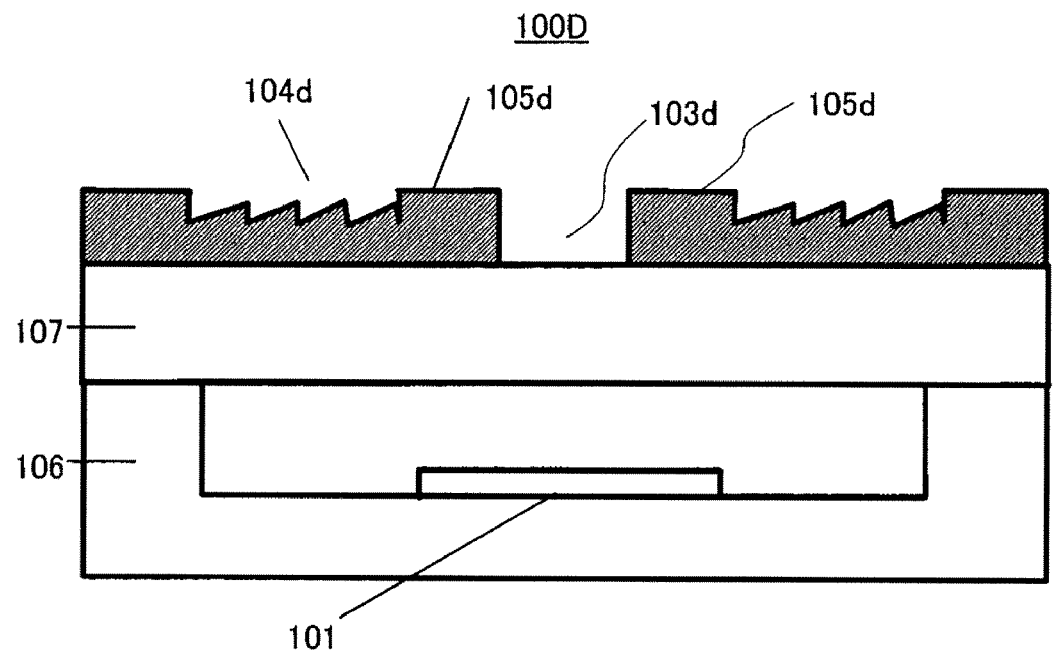
FIG. 7 is a schematic sectional view showing a variation of the sensor unit shown in FIG. 2.

Referring now to FIG. 7, a description will be given of a sensor unit 100D as a variation of the sensor unit 100. Here, FIG. 7 is a sectional view of the sensor unit 100D.

The second mark 104d of the sensor unit 100D is a relief formed in each light shielding portion 105d, and has one or more inclined surfaces and one or more perpendicular surfaces. The observation light projected onto the second mark 104d is reflected in a direction different from a direction in which the second sensor 102 is arranged due to the inclined surface. As a result, the brightness and darkness contrast is obtained between both surfaces of the mark 104d, and the second mark 104*d* can be highly precisely recognized, and the mark can be observed properly.

This embodiment can also forms the reflection mark that does not cause the unnecessary light that deteriorates the S/N ratio of the sensor that detects the transmitting light from the transmission mark. This embodiment aggressively reduces the reflected light on the mark area, and forms a high contrast mark.

This embodiment can prevent the unnecessary light that has passed the second (reflection) mark 104*d* from reaching the first sensor 101 in the measurement using the first (transmission) mark 103*d*. As a result, the sensor unit 100D reduces a measurement error, and provides a highly precise measurement.

Figure 8:
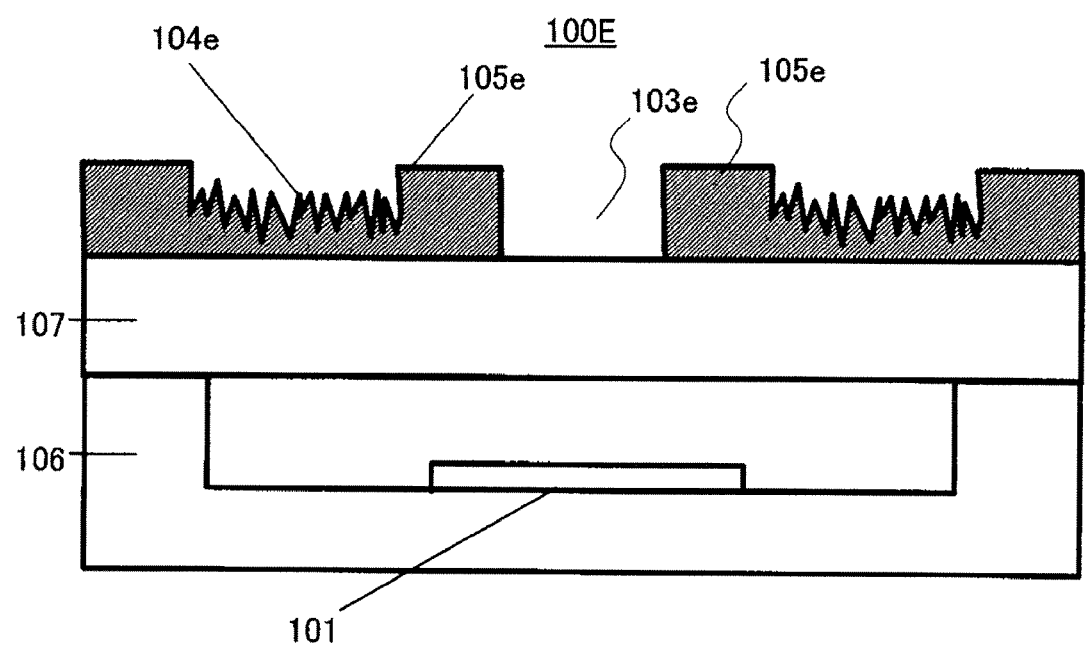
FIG. 8 is a schematic sectional view showing a variation of the sensor unit shown in FIG. 2.

Referring now to FIG. 8, a description will be given of a sensor unit 100E as a variation of the sensor unit 100. Here, FIG. 8 is a sectional view of the sensor unit 100E.

The second mark 104*e* of the sensor unit 100E is formed as a relief in each light shielding portion 105*d*, and has different surface roughness between inner and outer surfaces. Since the reflectance differs between the inner and outer surfaces of the second mark 104*e*, the second sensor 102 can detect the second mark 104*e* with good contrast.

This embodiment can form the second (reflection) mark 104*e* that does not cause the unnecessary light that deteriorates the S/N ratio of the sensor that detects the transmitting light from the transmission mark. This embodiment aggressively reduces the reflected light on the mark area, and forms a high contrast mark. In addition, this embodiment facilitates the process because the second mark can be formed by changing a process condition.

This embodiment can prevent the unnecessary light that has transmitted through the second (reflection) mark 104*e* from reaching the first sensor 101 in the measurement using the first (transmission) mark 103*e*. As a result, the sensor unit 100E reduces a measurement error, and provides a highly precise measurement.

Figure 9:
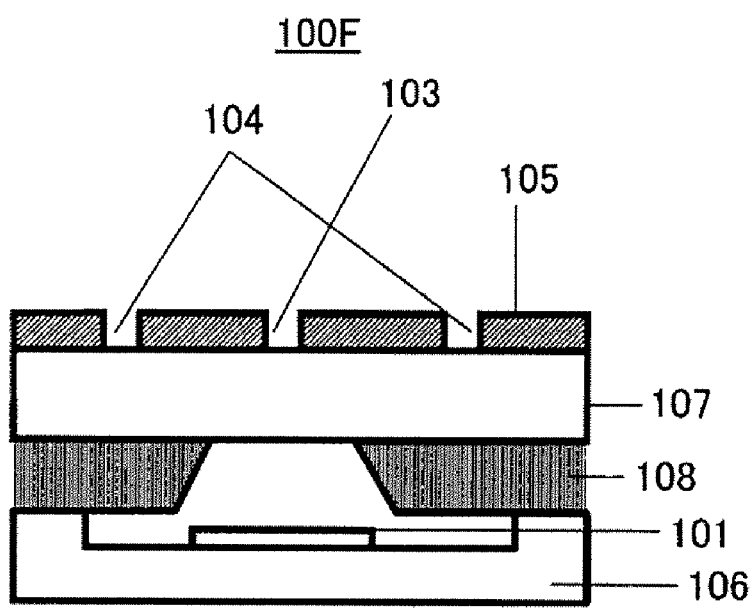
FIG. 9 is a schematic sectional view showing a variation of the sensor unit shown in FIG. 2.

Referring now to FIG. 9, a description will be given of a sensor unit 100F as a variation of the sensor unit 100. Here, FIG. 9 is a sectional view of the sensor unit 100F. The sensor unit 100F is different from the sensor unit 100 in that the light shielding portion 105 shown in FIG. 2 is changed to a light shielding structure 108. The sensor unit 100F forms the first and second marks 103 and 104 by removing the light shielding portion 105, as described above. In assembling the substrate 107 and the sensor package 106, the structure 108 is arranged between the sensor package 106 and the reference wafer W apart from the effective transmission space of the light from the first mark 103. As a result, the light that has transmitted through the second mark 104 that is formed by removing the light shielding portion is shielded, and no unnecessary light occurs which deteriorates the S/N ratio of the sensor that detects the transmitting light from the transmission mark.

An absorption film may be formed with a proper thickness at part to be shielded by the structure 108 on the back surface of the substrate 107. This configuration effectively restrain the light that repeats reflections and propagates in the substrate 107.

This embodiment can prevent the unnecessary light that has transmitted through the second (reflection) mark 104 from reaching the first sensor 101 in the measurement using the first (transmission) mark 103. As a result, the sensor unit 100F reduces a measurement error, and provides a highly precise measurement.

Figure 10:
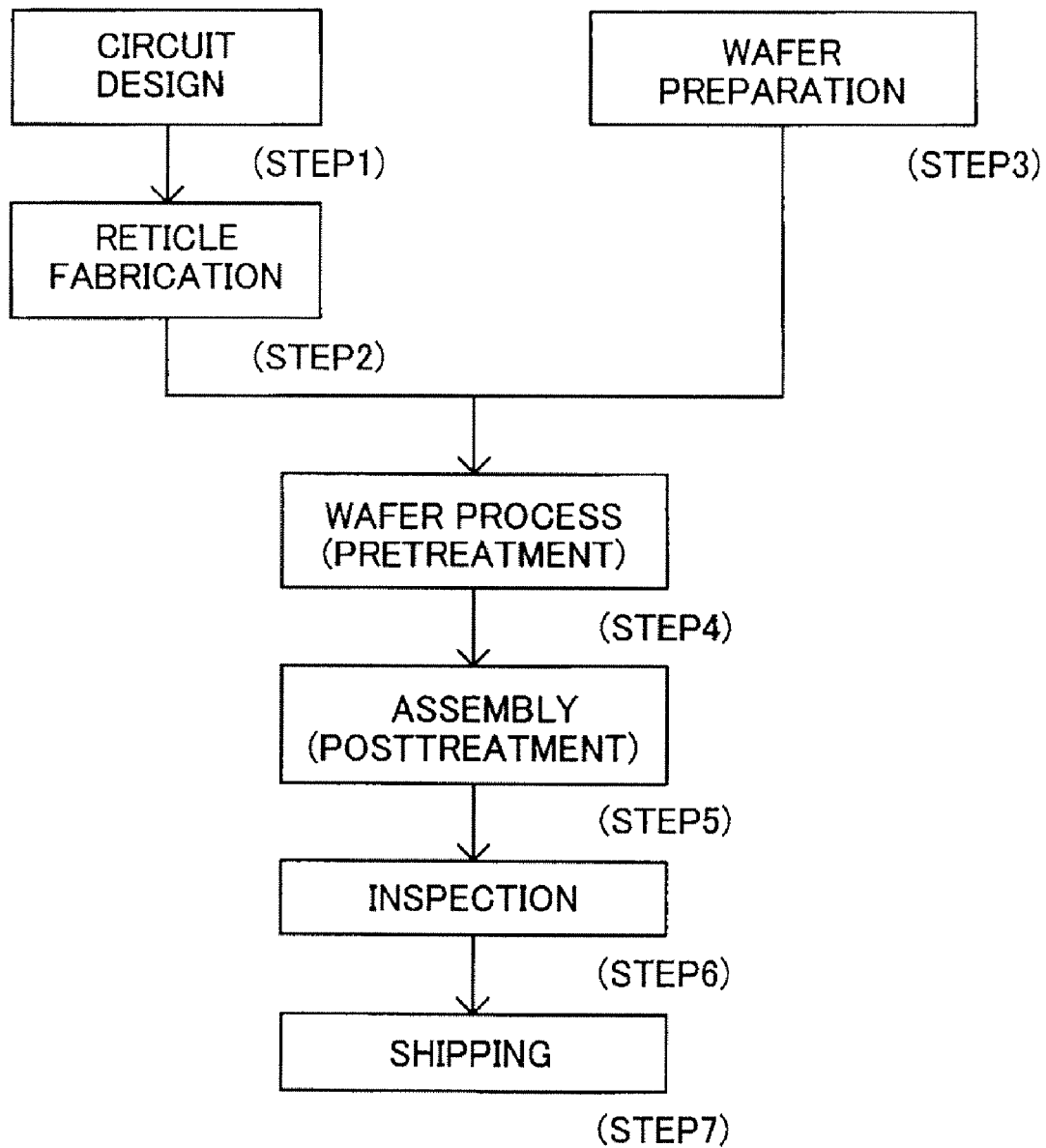
FIG. 10 is a flowchart for explaining a device manufacturing method using the exposure apparatus shown in FIG. 1.
Figure 11:
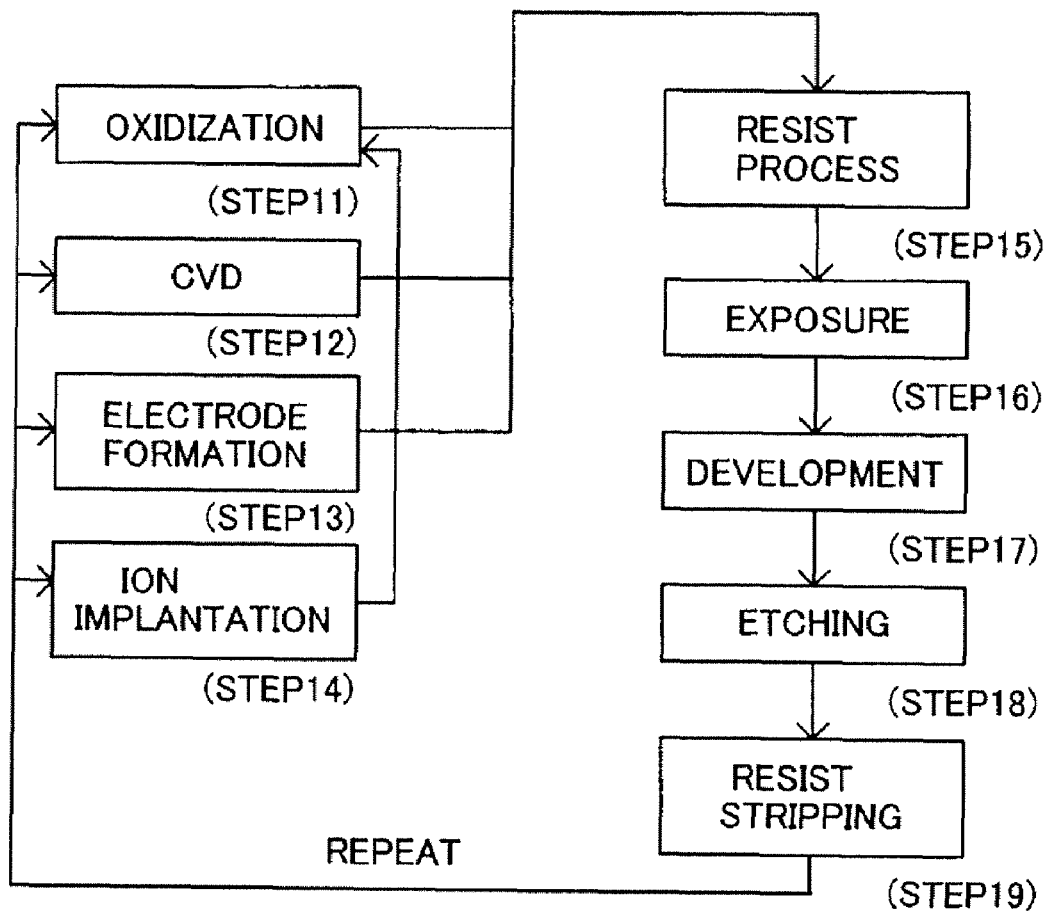
FIG. 11 is a detailed flowchart of a wafer process as Step 4 shown in FIG. 10.

Referring now to FIGS. 10 and 11, a description will be given of an embodiment of a device manufacturing method using the above exposure apparatus 1. FIG. 10 is a flowchart for explaining a fabrication of devices, such as a semiconductor device and an LCD device. Here, a description will be given of a fabrication of a semiconductor device as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is referred to as a pretreatment, forms actual circuitry on the wafer through photolithography using the reticle and wafer. Step 5 (assembly), which is also referred to as a post-treatment, forms into a semiconductor chip using the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 11 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the above exposure apparatus 1 to expose a reticle pattern onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. This device manufacturing method can manufacture higher quality devices than ever.

Further, the present invention is not limited to these preferred embodiments, and various variations and modifications may be made without departing from the scope of the present invention.

This application claims a benefit of priority based on Japanese Patent Application No. 2006-000615, filed on Jan. 5, 2006, which is hereby incorporated by reference herein in its entirety as if fully set forth herein.

What is claimed:

1. A sensor unit comprising:
   a light-transmissive substrate that has a first mark, and a second mark used to locate a position of the first mark; and
   a sensor for detecting light that has transmitted through the first mark and the substrate,
   wherein the substrate includes a light shielding film of a predefined thickness,
   wherein the light shielding film has the first mark and the second mark,
   wherein the first mark is an opening that is arranged on the light shielding film, and
   wherein the second mark is a step that is arranged on the light shielding film and is shallower than the predefined thickness.

2. A sensor unit according to claim 1, wherein the second mark is a corrugation formed on a surface of the light shielding film.

3. An exposure apparatus comprising:
   a projection optical system for projecting a pattern of a reticle onto a substrate; and
   a sensor unit according to claim 1 for detecting light that has passed the projection optical system.

4. A device manufacturing method, comprising the steps of:

exposing a substrate by using the exposure apparatus according to claim 3; and developing the exposed substrate.

5. A sensor unit according to claim 1 wherein the light shielding film includes a first light shielding film arranged on the substrate and a second light shielding film arranged on the first light shielding film, and wherein a surface of the second mark is a surface of the second light shielding film.

6. A sensor unit according to claim 1, wherein a surface of the second mark inclines for a surface of the light shielding film.

7. A sensor unit according to claim 1, wherein an asperity of a surface of the second mark is larger than an asperity of a surface of the light shielding film.

* * * * *